(12) United States Patent
Lee et al.

(10) Patent No.: US 12,733,123 B2
(45) Date of Patent: Sep. 8, 2026

(54) CABINET AND SERVER

(71) Applicant: Fulian Precision Electronics (Tianjin) Co., LTD., Tianjin (CN)

(72) Inventors: I-Chieh Lee, New Taipei (TW); Jia-Feng Lin, New Taipei (TW); Chieh-Hsiang Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 80 days.

(21) Appl. No.: 18/962,214

(22) Filed: Nov. 27, 2024

(65) Prior Publication Data

US 2025/0275080 A1 Aug. 28, 2025

(30) Foreign Application Priority Data

Feb. 22, 2024 (CN) ......................... 202410199070.8

(51) Int. Cl.
*H05K 7/14* (2006.01)

(52) U.S. Cl.
CPC .................................. *H05K 7/1489* (2013.01)

(58) Field of Classification Search
CPC .. H05K 7/1489; H05K 7/1488; H05K 7/1485; H05K 7/1487; H05K 5/023; H05K 5/0208; G06F 1/183; G06F 1/182; G06F 1/18
See application file for complete search history.

(56) References Cited

U.S. PATENT DOCUMENTS 10,045,458 B2 * 8/2018 Yu ........................ H05K 7/1487
11,310,932 B2 * 4/2022 Chang ...................... H05K 7/16
11,792,952 B2 * 10/2023 Mao ..................... H05K 7/1492 361/601
2020/0396859 A1 * 12/2020 Liu ...................... G11B 33/128

FOREIGN PATENT DOCUMENTS

TW 202341856 A * 11/2023

* cited by examiner

*Primary Examiner* — Dimary S Lopez Cruz
(74) *Attorney, Agent, or Firm* — ScienBiziP, P.C.

(57) ABSTRACT

A cabinet comprises a chassis, a bracket, and a self-locking component. The bracket comprises a support and a handle, the support is movable between a work position and a transition position and the support is further rotatable between the transition position and an open position relative to the chassis, the handle is rotatable between a handle-lifted-up position and a handle-pressed-down position relative to the support. The self-locking component is connected to the support and the chassis. When the handle rotates from the handle-pressed-down position to the handle-lifted-up position, the support moves from the work position to the transition position; when the support rotates from the transition position to the open position, the support extends out of the chassis, the self-locking component is configured for locking the support at the open position, to expose a space under the bracket. A server with the cabinet is also disclosed.

15 Claims, 15 Drawing Sheets

CABINET AND SERVER

FIELD

The disclosure herein generally relates to information computing systems, and more particularly relates to a cabinet and a server.

BACKGROUND

Server usually has two layers of spaces to install electronic devices, and electronic devices in each layer sometimes need to be removed for maintenance or replacement, however, the traditional way of installing and removing the electronic devices is inconvenient, resulting in low efficiency.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
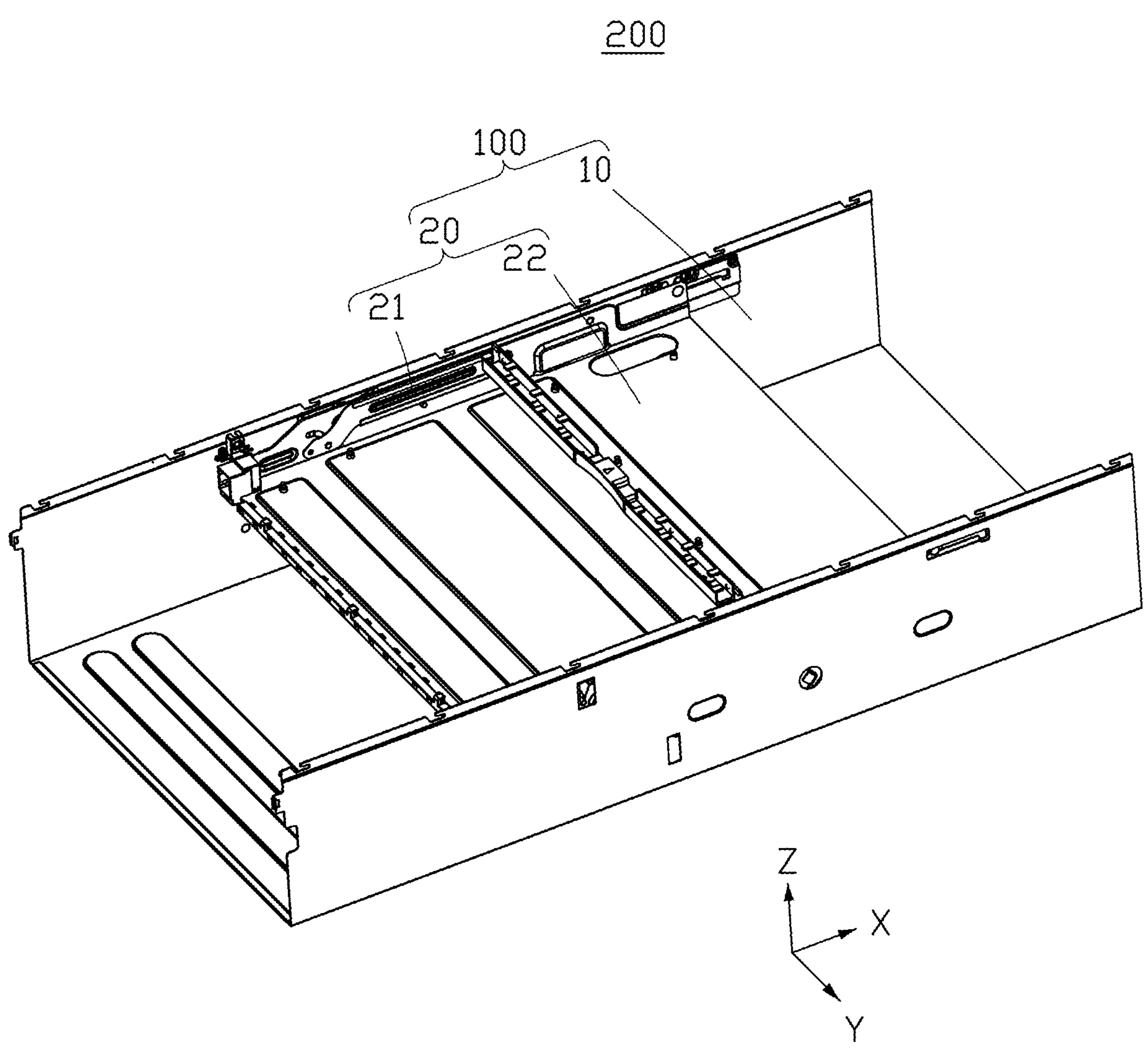
FIG. 1 is an isometric view of an embodiment of a cabinet of a server according to the present disclosure, showing the cabinet in a working state.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1 to FIG. 4, a server 200 in an embodiment includes a cabinet 100 and a plurality of electronic devices. The plurality of electronic devices are installed in the cabinet 100, and the plurality of electronic devices can be removed from the cabinet 100. The cabinet 100 has a lower-layer space and an upper-layer space within, the upper-layer space is above the lower-layer space. Some of the plurality of electronic devices are placed in the lower-layer space and others of the plurality of electronic devices are placed in the upper-layer space. For example, electronic devices can be motherboards, hard drives, expansion cards and so on.

Figure 3:
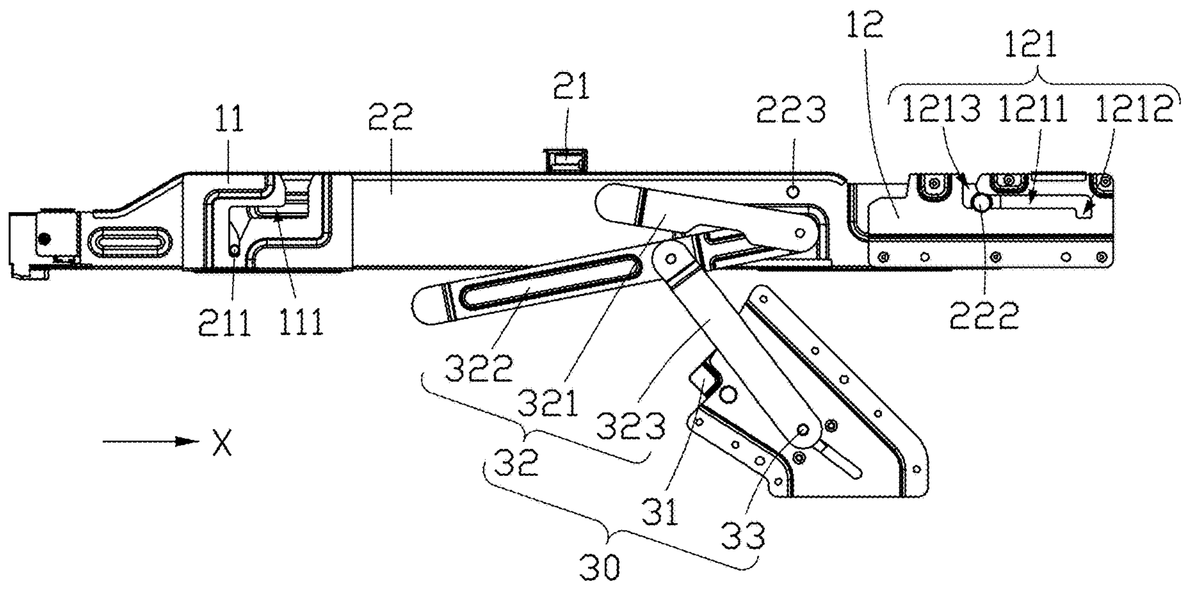
FIG. 3 is a side view of the cabinet in FIG. 1, showing the cabinet in the working state.
Figure 4:
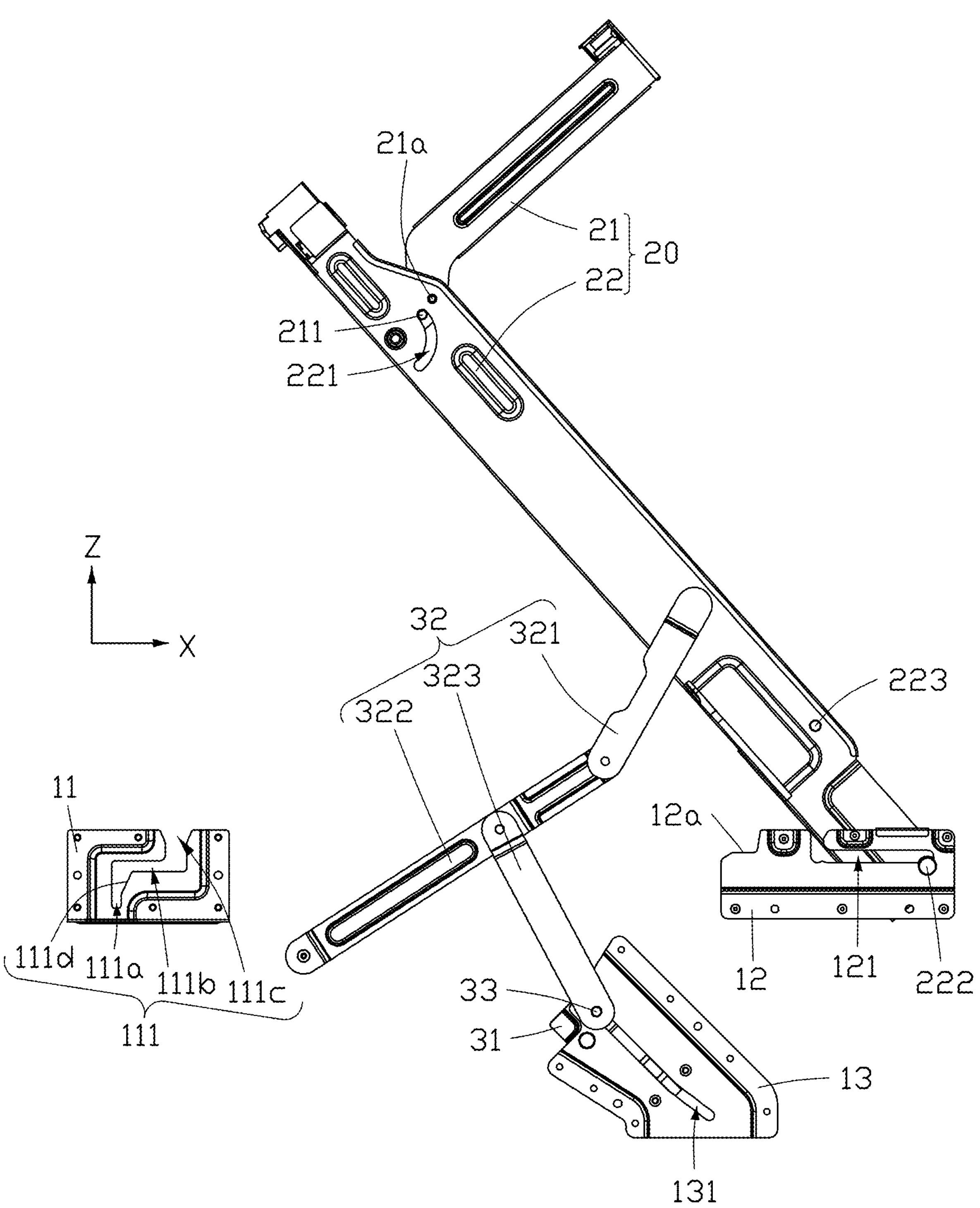
FIG. 4 is a side view of the cabinet in FIG. 2, showing the cabinet in the open state.
Figure 10:
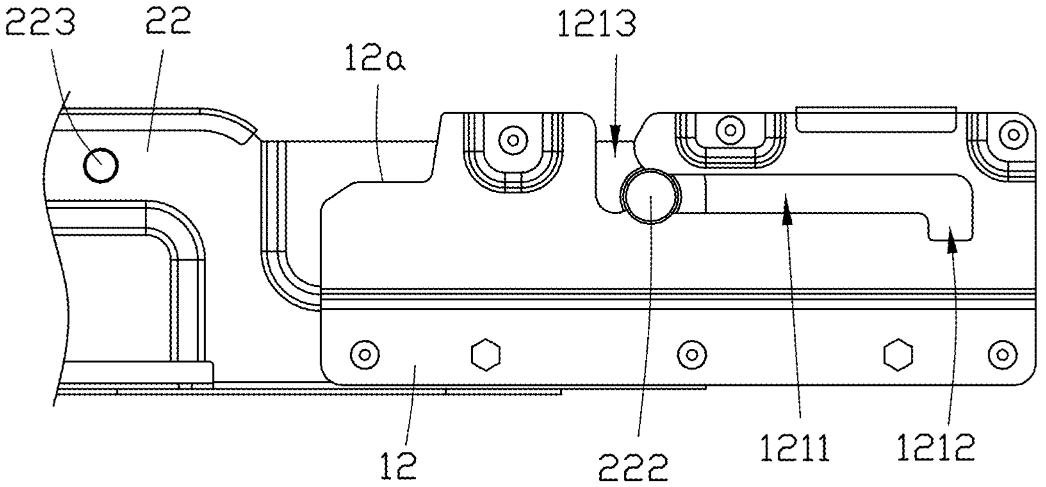
FIG. 10 is a side view of a part of the cabinet and a second sheet in FIG. 3, showing a support at a work position.
Figure 11:
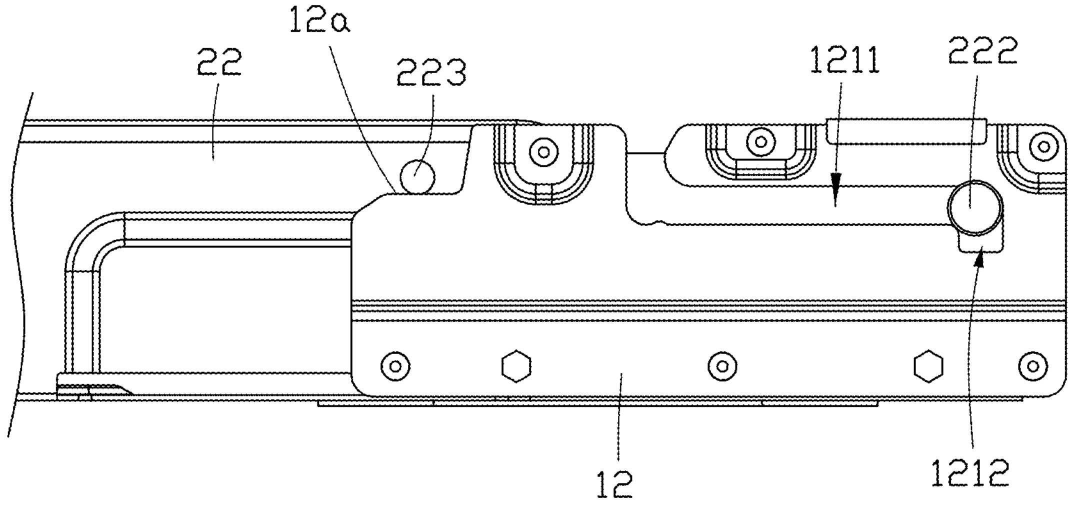
FIG. 11 is a side view of the part of the cabinet and the second sheet in FIG. 10, showing the support at a transition position.
Figure 14:
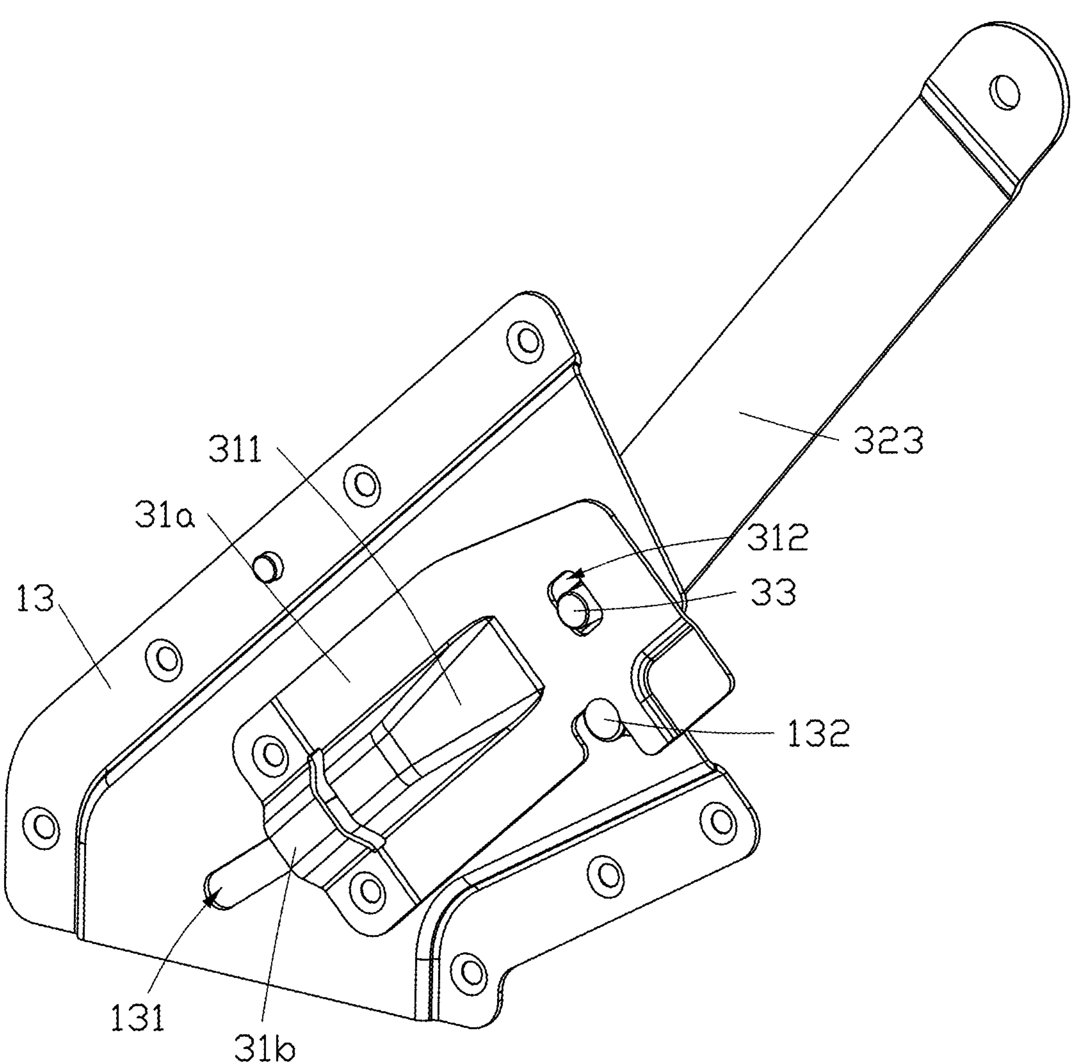
FIG. 14 is an isometric view of the self-locking component in FIG. 13, showing a third pin positioned in a limiting hole.

The cabinet 100 includes a chassis 10, a bracket 20, and a self-locking component 30. The chassis 10 is a part of the shell of the server 200, and the lower-layer space and the upper-layer space are inside the chassis 10. The chassis 10 is used to hold electronic devices in the lower-layer space. The bracket 20 includes a handle 21 and a support 22, as shown in FIG. 5 to FIG. 9, the support 22 is used to hold electronic devices in the upper-layer space. The support 22 is movable relative to the chassis 10 between a work position and a transition position, FIGS. 3, 6 and 10 show that the support 22 is at the work position and FIGS. 8 and 11 show that the support 22 is at the transition position. The support 22 is also rotatable relative to the chassis 10 between a transition position and an open position, FIGS. 4 and 14 show that the support 22 is at the open position. The self-locking component 30 connects the chassis 10 and the support 22, the self-locking component 30 is used to lock the support 22 at the open position.

The support 22 between the work position and the transition position is in the upper-layer space, but the support 22 at the open position extends out of the chassis 10, to expose the lower-layer space, so that it is more convenient to remove or install the electronic devices in the lower-layer space, because if the support 22 stays in the upper-layer space, the lower-layer space is covered by the support 22, and it is inconvenient to remove or install the electronic devices in the lower-layer space.

In some embodiments, the support 22 is used to fix a motherboard. When the support 22 is at the work position, the motherboard is plugged into a socket of the server 200. When the support 22 is at the transition position, the motherboard is pulled out of the socket of the server 200. When the support 22 is at the open position, the support 22 lifts the motherboard out of the chassis 10, so the motherboard can be removes or installed easier.

As shown in all figures, the support 22 moves in a direction X between the work position and the transition position, the support 22 rotates around a direction Y between the transition position and the open position, the lower-layer space and the upper-layer space are arranged in a direction Z, the direction X and the direction Y is horizontal, the direction Z is vertical.

As shown in FIG. 5 to FIG. 9, the handle 21 is used to be held by users. The handle 21 is rotatably installed on the support 22. The handle 21 is rotatable between a handle-lifted-up position and a handle-pressed-down position relative to the support 22.

Figure 2:
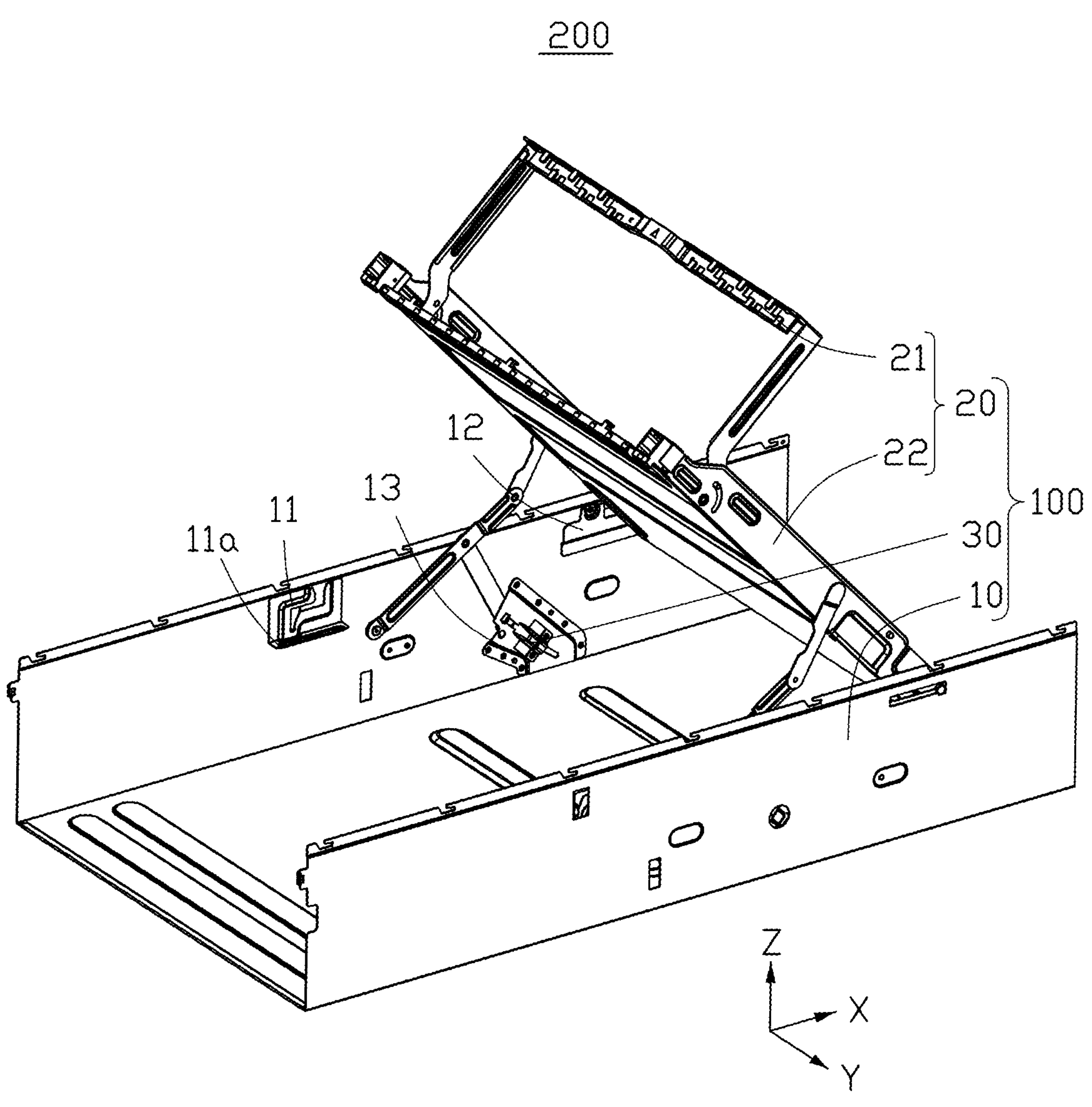
FIG. 2 is an isometric view of the cabinet in FIG. 1, showing the cabinet in an open state.
Figure 5:
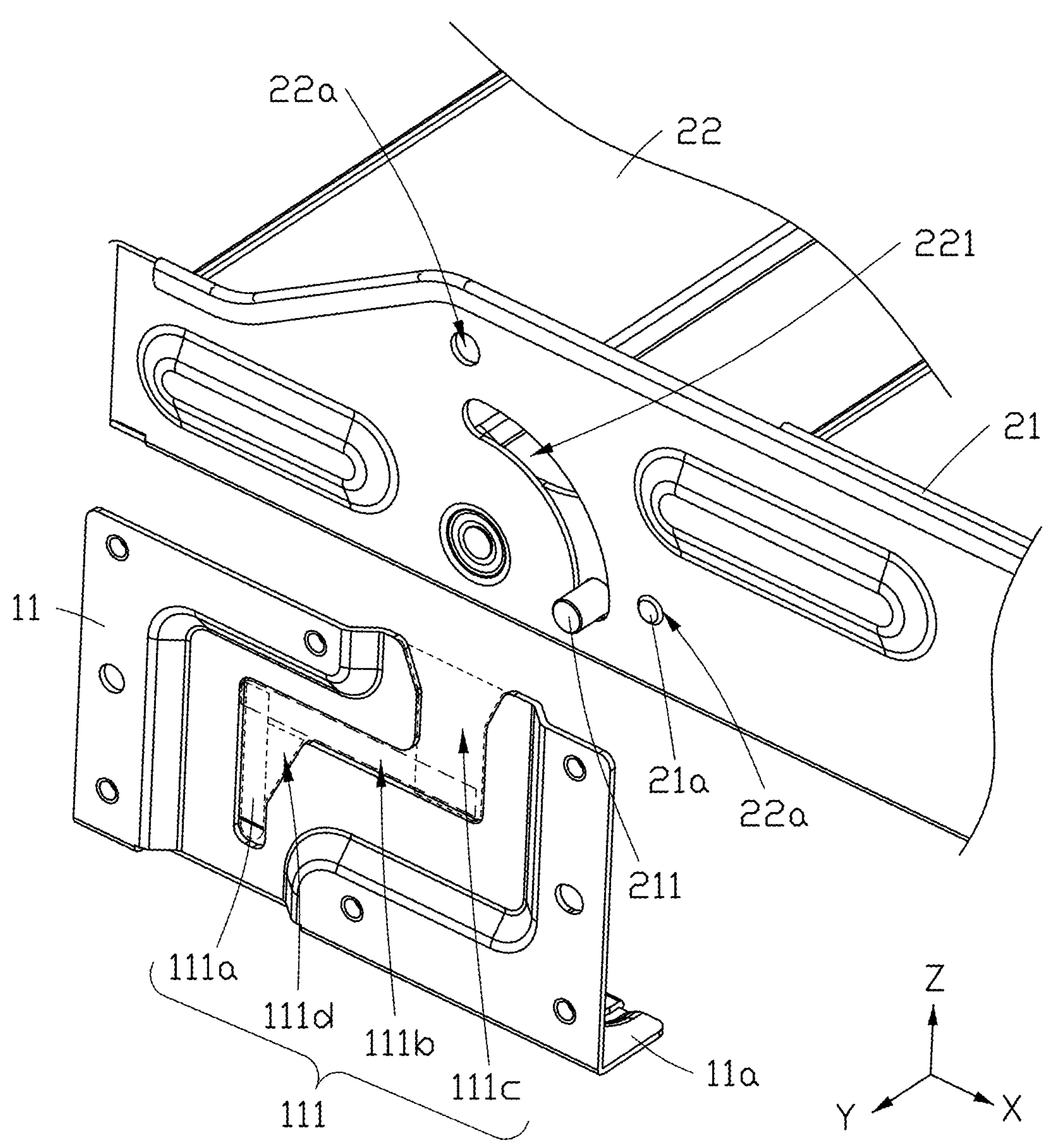
FIG. 5 is an exploded view of the cabinet in FIG. 3, showing a first sheet disassembled from the cabinet.
Figure 6:
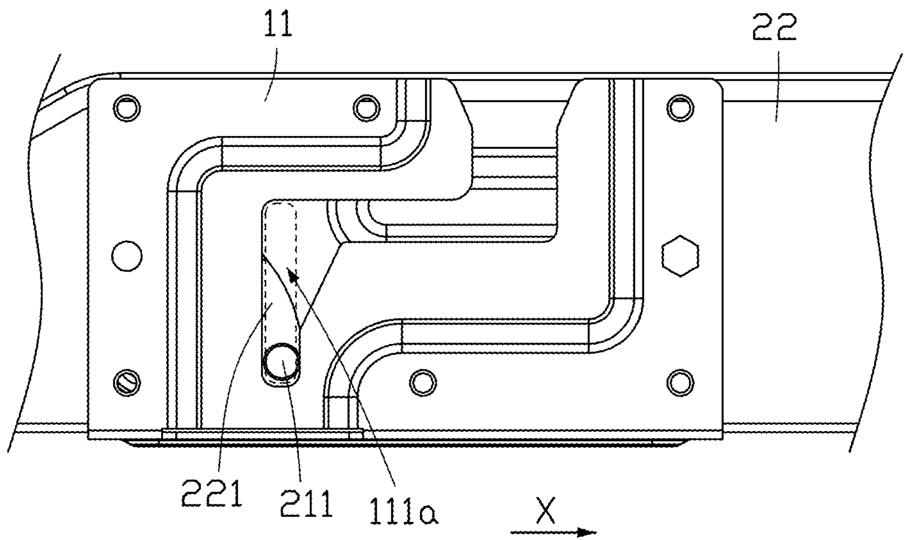
FIG. 6 is a side view of a part of the cabinet in FIG. 3 and the first sheet in FIG. 5, showing a support on a work position and a handle on a handle-pressed-down position.

As shown in FIG. 2 and FIG. 5, in some embodiments, the chassis 10 has two first sheets 11 and two second sheets 12, the two first sheets 11 are fixed on the two opposite side of the chassis 10 in the direction Y, the two second sheets 12 are also fixed on the two opposite side of the chassis 10 in the direction Y, and the first sheet 11 and the second sheet 12 on the same side are arranged in the direction X. Each first sheet 11 has a bended sheet 11*a* on the bottom, the two bended sheets 11*a* are in the same horizontal plane, the two bended sheets 11*a* are used to support the support 22, so that the support 22 will not drop down to the lower-layer space by gravity, and the support 22 slides on the two bended sheets 11*a* between the work position and the transition position.

As shown in FIG. 5 to FIG. 9, the handle 21 has two first pins 211 on two opposite sides in the direction Y, the support 22 has two arc grooves 221 on two opposite sides in the direction Y, the first pin 211 extends through the arc groove 221 on the same side, and the first pin 211 is slidable in the arc groove 221, when the handle 21 arrives at handle-lifted-up position, the first pin 211 is on a top end of the arc groove 221, and when the handle 21 arrives at handle-pressed-down position, the first pin 211 is on a bottom end of the arc groove 221.

As shown in FIG. 5 to FIG. 9, each first sheet 11 of the chassis 10 has a first sliding groove 111. The first pin 211 is also slidable into or out of the first sliding groove 111 on the same side. The first sliding groove 111 includes a first segment 111*a*, a second segment 111*b*, and a third segment 111*c*, the first segment 111*a* and the third segment 111*c* extend in the direction Z, the second segment 111*b* extends in the direction X, the left end of the second segment 111*b* is communicated to the top end of the first segment 111*a*, the right end of the second segment 111*b* is communicated to the bottom end of the third segment 111*c*, the top end of the third segment 111*c* extends through the first sheet 11 to allow the first pin 211 to slide into or out of the first sliding groove 111.

When the motherboard is plugged into the socket, the support 22 is at the work position and the handle 21 is at the handle-pressed-down position, the first pin 211 is on a bottom end of the first segment 111*a*. When users rotate up the handle 21 from the handle-pressed-down position to the handle-lifted-up position (from FIG. 6 to FIG. 7), because the first pin 211 is limited in the first segment 111*a* and the arc groove 221 simultaneously, the first pin 211 pushes against the left-side of the first segment 111*a* shown in FIG. 6 and FIG. 7 during the rotation of the handle 21, so that the support 22 is moved towards the transition position, to disconnect the motherboard from the socket; when the handle 21 arrives at handle-lifted-up position, it means the handle 21 is fully lifted up, but the support 22 is just at a location between the work position and the transition position, which means the motherboard is not fully disconnected from the socket.

Then users need to pull the handle 21 horizontally, to move the support 22 towards the transition position (from FIG. 7 to FIG. 8), and when the first pin 211 is at the right end of the second segment 111*b*, the support 22 arrives at the transition position, at this moment, the motherboard is fully disconnected from the socket, and the first pin 211 arrives at the bottom end of the third segment 111*c*.

Figure 8:
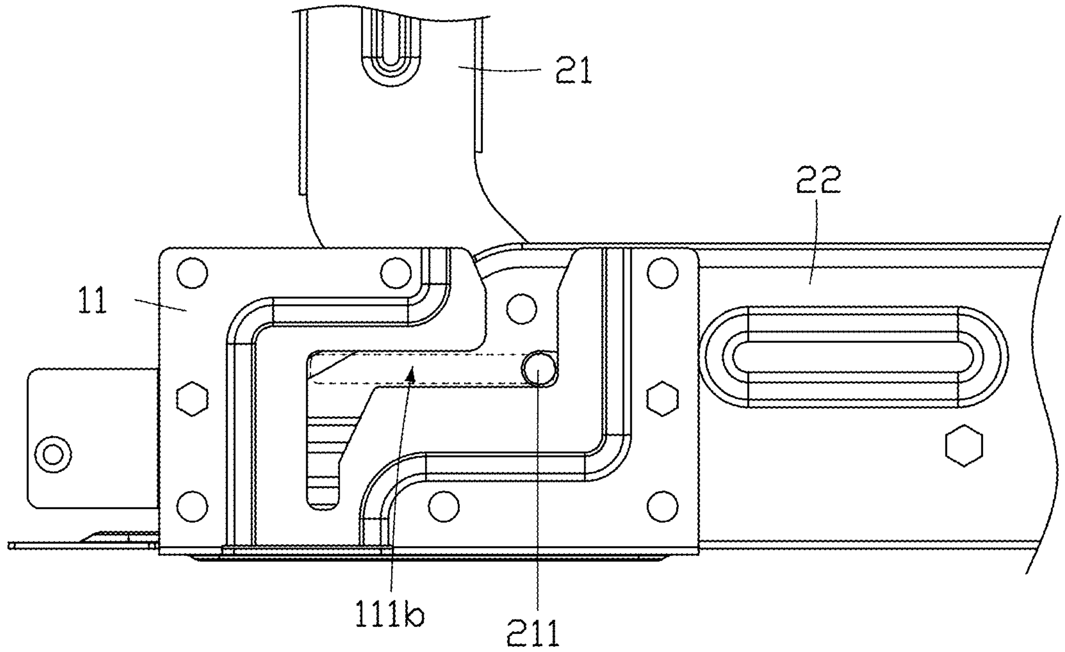
FIG. 8 is a side view of the part of the cabinet in FIG. 7 and the first sheet in FIG. 5, showing the support on a transition position.
Figure 9:
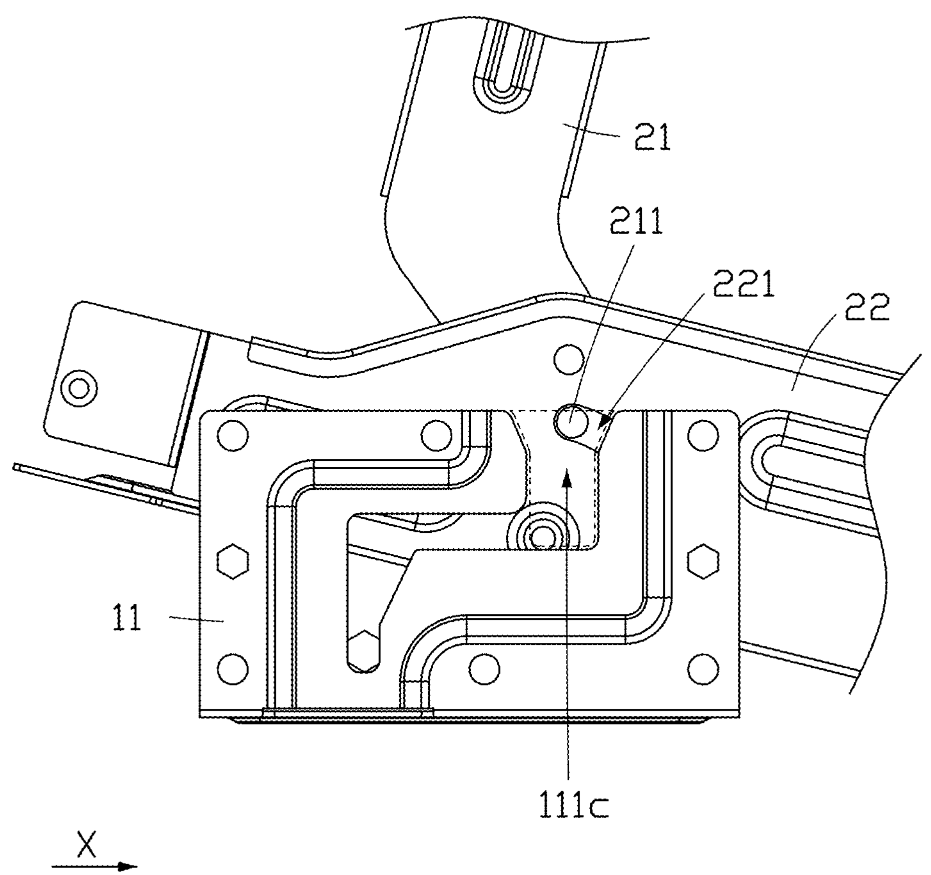
FIG. 9 is a side view of the part of the cabinet in FIG. 8 and the first sheet in FIG. 5, showing the support rotated to an open position.

Then users need to pull up the handle 21 and the support 22 together, to rotate the support 22 from the transition position to the open position, and during the rotation, the first pin 211 slides out of the top end of the third segment 111*c* (from FIG. 8 to FIG. 9).

On the contrary, when the motherboard needs to be plugged back into the socket, users press down the handle 21 and the support 22 together, to rotate the support 22 from the open position to the transition position, the first pin 211 will enter the top end of the third segment 111*c*, and then slide down to the bottom end of the third segment 111.

Then users need to pull the handle 21 horizontally, to move the support 22 towards the work position, until the first pin 211 arrives at the left end of the second segment 111*b*. But at this moment the motherboard is not fully plugged into the socket.

Figure 7:
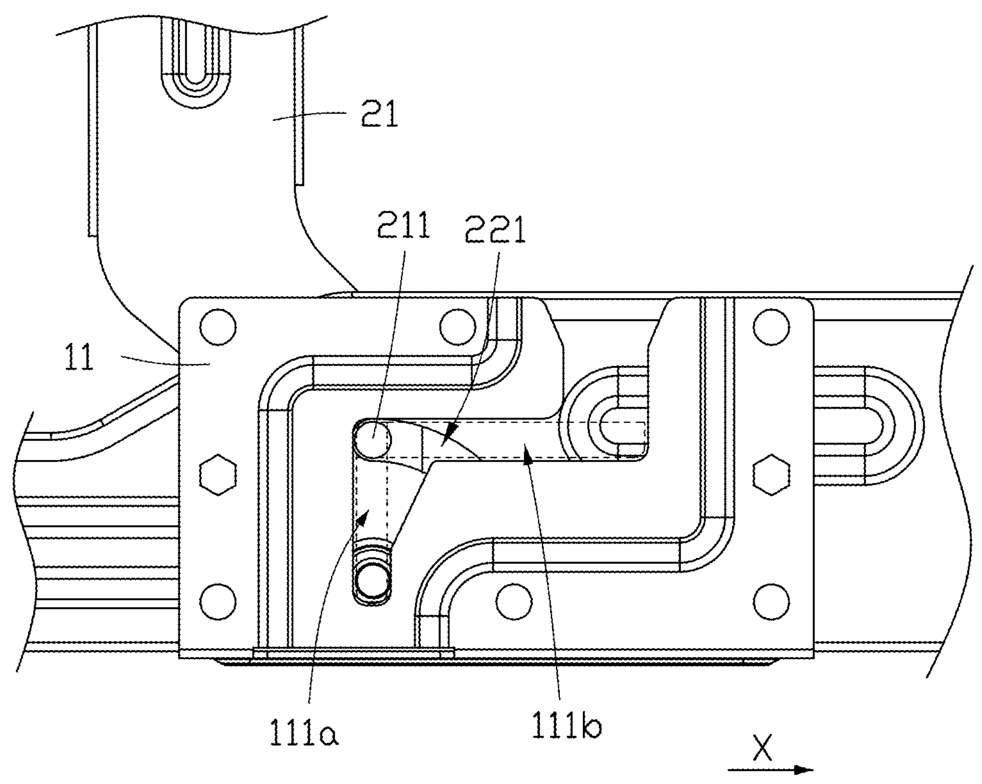
FIG. 7 is a side view of the part of the cabinet in FIG. 6 and the first sheet in FIG. 5, showing the handle on a handle-lifted-up position.

Then users need to rotate down the handle 21 from the handle-lifted-up position to the handle-pressed-down position (from FIG. 7 to FIG. 6), because the first pin 211 is limited in the first segment 111*a* and the arc groove 221 simultaneously, the first pin 211 pushes against the right-side of the first segment 111*a* shown in FIG. 6 and FIG. 7 during the rotation of the handle 21, so that the support 22 is moved towards the work position. When the handle 21 arrives at the handle-pressed-down position, the support 22 arrives at the work position, at this moment, the motherboard is fully plugged into the socket.

In some embodiments, to avoid blocking the first pin 211, there is a chamfer 111*d* between the first segment 111*a* and the second segment 111*b*, the chamfer 111*d* is used to prevent the first pin 211 from being stuck when entering the first segment 111*a* from the second segment 111*b*.

In some embodiments, the first pin 211 is a cylindrical pin, the width of the first segment 111*a*, the width of the second segment 111*b*, and the diameter of the first pin 211 are equal. The width of the third segment 111*c* is larger than the diameter of the first pin 211, so that it is convenient for first pin 211 to enter or leave third segment 111*c*.

In some embodiments, as shown in FIG. 4 and FIG. 5, the support 22 has a positioning hole 22*a*, the handle 21 has a latch 21*a* and a spring (not shown in figures). When the handle 21 arrives at the handle-lifted-up position, the latch 21*a* is aligned with the positioning hole 22*a*, the spring pushes the latch 21*a* into the positioning hole 22*a*, to position the handle 21 at the handle-lifted-up position, so that users can better push or pull the support 22 by the handle 21. When users need to press down the handle 21 to the handle-pressed-down position, users need to pull out the latch 21*a* from the positioning hole 22*a* by hand, to unlock the handle 21 from the support 22, then the handle 21 can be pressed down to the handle-pressed-down position.

Figure 12:
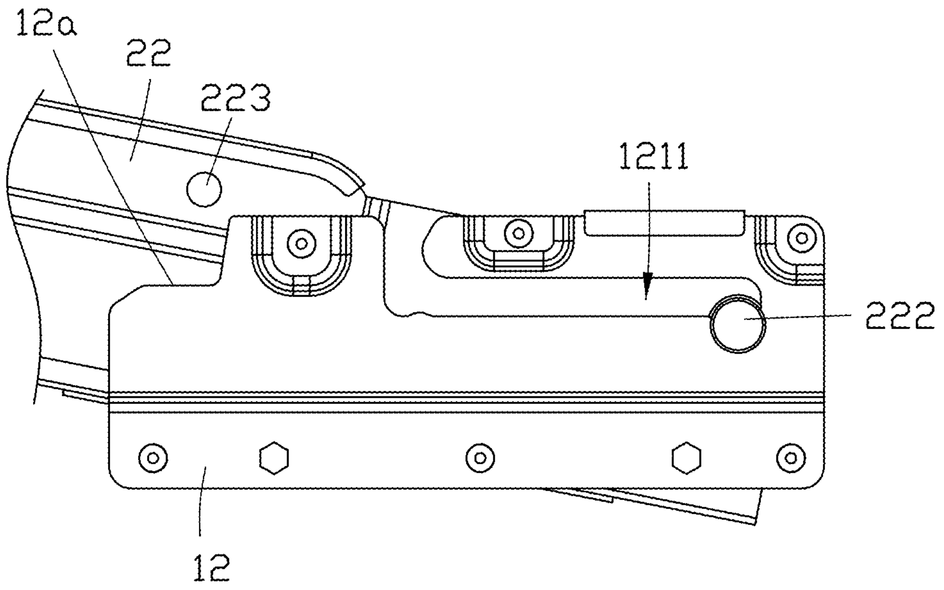
FIG. 12 is a side view of the part of the cabinet and the second sheet in FIG. 11, showing the support rotated to an open position.

As shown in FIG. 10 to FIG. 12, in some embodiments, each second sheet 12 of the chassis 10 has a second sliding groove 121, the support 22 has a second pin 222, the second pin 222 is slidably inserted in the second sliding groove 121. The second sliding groove 121 includes a straight-line segment 1211 and a positioning segment 1212. The straight-line segment 1211 extends along the direction X, the positioning segment 1212 extends along the direction Y and is communicated to an end of the straight-line segment 1211. When the support 22 moves between the work position and the transition position, the second pin 222 slides in the straight-line segment 1211, so the second sheet 12 of the chassis 10 can support the support 22 by supporting the second pin 222, which means the support 22 is not only supported by the bended sheet 11*a* mentioned-above, but also supported by the second sheet 12. When the support 22 arrives at the transition position, the second pin 222 arrives at an top end of the positioning segment 1212, and when the support 22 rotates from the transition position to the open position, due to the gravity and inertia of the support 22, the second pin 222 will naturally fall into the positioning segment 1212, and the positioning segment 1212 is used for positioning the second pin 222, to stop the second pin 222 from moving along the direction X, so that the support 22 can rotate around the second pin 222 stably.

Furthermore, when the support 22 rotates from the open position back to the transition position, the second pin 222 needs to be moved from the positioning segment 1212 back to the straight-line segment 1211, so as shown in FIG. 11, the support 22 has a lever shaft 223, the second sheet 12 of the chassis 10 has a supporting surface 12*a*, the supporting surface 12*a* is horizontal. When users press down the handle 21 to rotate the support 22 from the open position back to the transition position, the lever shaft 223 will push against the supporting surface 12*a* at a moment, then the support 22 can rotates around the lever shaft 223, so the second pin 222 can be tilted up into the straight-line segment 1211 by the lever principle, then the second pin 222 can slide in the straight-line segment 1211 along the direction X, which allows the support 22 to move from the transition position back to the work position.

Furthermore, the second sliding groove 121 further includes an assembling segment 1213, the assembling segment 1213 is communicated to the straight-line segment 1211 and extends through the top of the second sheet 12. When assembling the second pin 222 into the straight-line segment 1211, the second pin 222 passes through the assembling segment 1213 to the straight-line segment 1211.

Figure 13:
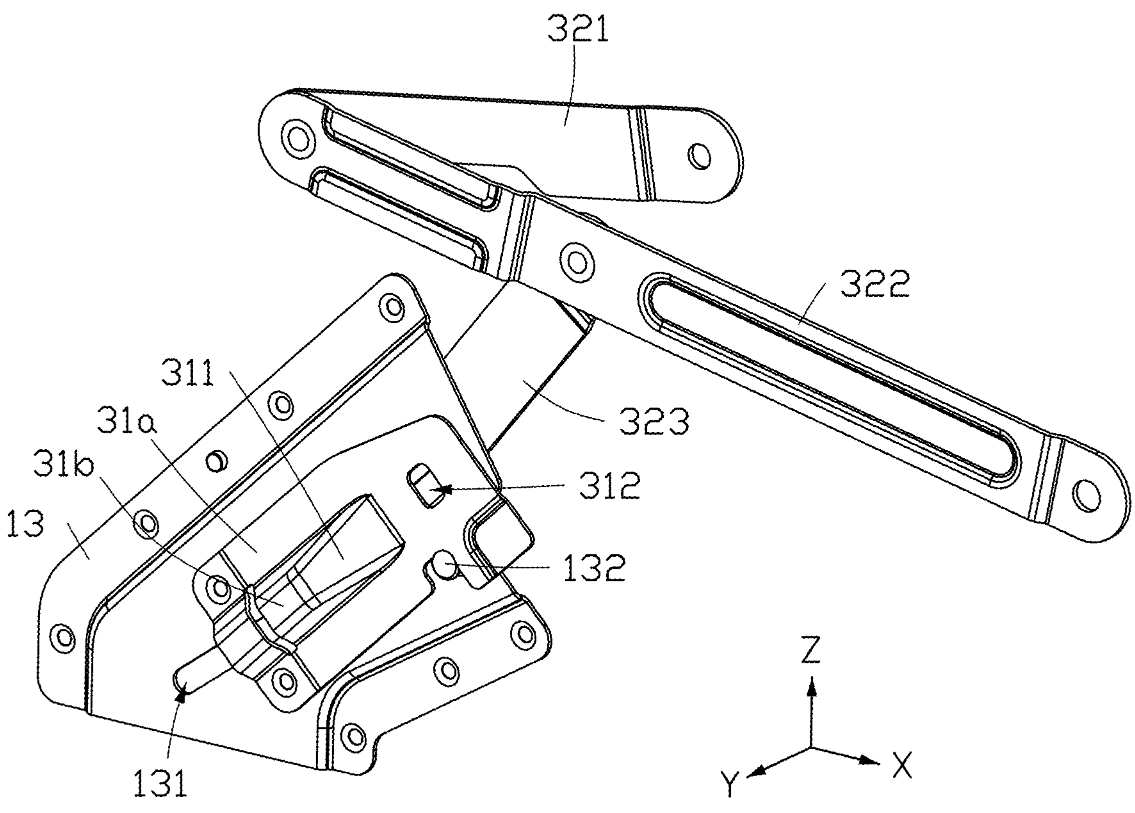
FIG. 13 is an isometric view of an embodiment of a self-locking component of according to the present disclosure.
Figure 15:
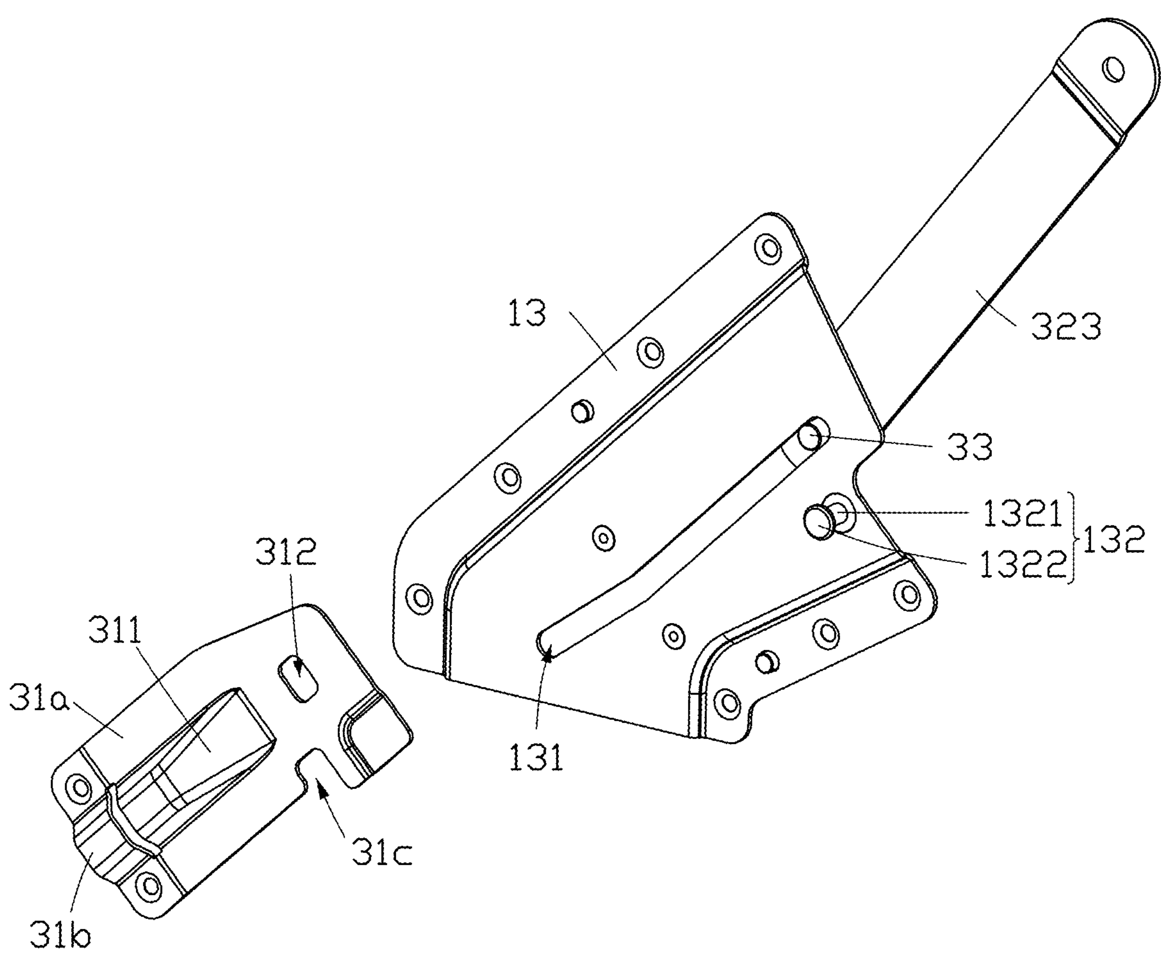
FIG. 15 is an exploded view of the self-locking component in FIG. 14.

As shown in FIG. 13 to FIG. 15, in some embodiments, the chassis 10 has a third sheet 13, the third sheet 13 has a third sliding groove 131, the third sliding groove 131 extends obliquely. The self-locking component 30 includes a spring sheet 31, a link rod component 32, and a third pin 33, the spring sheet 31 is located on the third sheet 13 of the chassis 10, the link rod component 32 connects the support 22 and the third pin 33, the third pin 33 is slidably inserted in the third sliding groove 131, the support 22 can slide the third pin 33 in the third sliding groove 131 by the link rod component 32. The spring sheet 31 has a bevel 311 and a limiting hole 312. When the support 22 rotates from the transition position to the open position, the third pin 33 will push against the bevel 311, to deform the spring sheet 31 away from the third sheet 13. When the third pin 33 arrives at the limiting hole 312, the spring sheet 31 resets naturally, and the third pin 33 inserts into the limiting hole 312 simultaneously, then the third pin 33 is positioned in the limiting hole 312, so the support 22 is positioned at the open position. When users need to rotate the support 22 from the open position back to the transition position, users need to pull the spring sheet 31 by hand, to deform the spring sheet 31 away from the third sheet 13, until the third pin 33 is pulled out of the limiting hole 312, then the support 22 can be rotated from the open position back to the transition position.

Furthermore, the link rod component 32 includes a first link rod 321, a second link rod 322, and a third link rod 323. An end of the first link rod 321 connects an end of the second link rod 322, another end of the first link rod 321 connects the support 22, another end of the second link rod 322 connects the third sheet 13, an end of the third link rod 323 connects the second link rod 322 at non-ends, another end of the third link rod 323 connects the third pin 33. During the movement or the rotation of the support 22, the end of the first link rod 321 connected to the support 22 must move and rotate with the support 22, and the second link rod 322 must be rotated by the first link rod 321, and the third link rod 323 must be moved and rotated by the second link rod 322, and finally the third pin 33 must be moved in the third sliding groove 131.

Furthermore, the spring sheet 31 includes a plane section 31*a* and a bump section 31*b*, the limiting hole 312 is defined on the plane section 31*a*, the plane section 31*a* is installed on the third sheet 13 by screws, the bump section 31*b* is arched relative to the plane section 31*a*, the bevel 311 is defined on the bump section 31*b*. When the support 22 rotates from the transition position to the open position, the third pin 33 pushes against the bevel 311 to deform the plane section 31*a* away from the third sheet 13, the plane section 31*a* resets until the third pin 33 goes into the limiting hole 312.

Furthermore, the plane section 31*a* has a notch 31*c*, the third sheet 13 of the chassis 10 has a guiding nail 132, the guiding nail 132 includes a cylinder 1321 and a nail head 1322, the cylinder 1321 extends through the notch 31*c* and is used to guide the deformation of the plane section 31*a*, the nail head 1322 is used to stop the deformation of the plane section 31*a* along the cylinder 1321, to avoid the plane section 31*a* from breaking due to excessive deformation.

In some embodiments, the first sheet 11, the second sheet 12, the third sheet 13, and the chassis 10 are formed by an integrated molding process, and thus, the first sliding groove 111, the second sliding groove 121, the supporting surface 12*a*, and the third sliding groove 131 are all defined on the chassis 10.

In summary, the process of using cabinet 100 is: define an working state of cabinet 100 in which the support 22 is at the work position and the handle 21 is at the handle-pressed-down position, and the motherboard on the support 22 is plugged into the socket of the server 200 in the upper-layer space; when users need to maintain electronic devices in the lower-layer space, users hold the handle 21 and rotate the handle 21 from the handle-pressed-down position to the handle-lifted-up position, during the rotation of the handle 21, the first pin 211 limited in the first segment 111*a* pushes against the first sheet 11 of the chassis 10, so the support 22 is moved to the transition position, and when the handle 21 arrives at the handle-lifted-up position, the latch 21*a* inserts into the positioning hole 22*a*, to position the handle 21 on the handle-lifted-up position; after the handle 21 is positioned on the handle-lifted-up position, users need to pull the handle 21 horizontally along the direction X, to move the support 22 to the transition position; after the support 22 arrives at the transition position, users need to lift up the handle 21 to rotate the support 22 to the open position, at the moment the rotation begins, the second pin 222 moves into the positioning segment 1212 from the straight-line segment 1211, and the first pin 211 slides out of the third segment 111*c*, until the support 22 arrives at the open position, the third pin 33 is positioned in the limiting hole 312 simultaneously, at this moment, the cabinet 100 is in an open state, so that users can maintain electronic devices in the lower-layer space easily.

When users need to put the cabinet 100 from the open state to the working state, users need to pull the plane section 31*a* of the spring sheet 31 by hand, to get the third pin 33 out of the limiting hole 312, then user can press down the handle 21 to rotate the support 22 back to the transition position; during the rotation of the support 22 back to the transition position, the lever shaft 223 pushes against the supporting surface 12*a*, letting the support 22 rotates around the lever shaft 223, so the second pin 222 can be lifted out of the positioning segment 1212 and goes into the straight-line segment 1211 by level principle; after the support 22 arrives at the transition position, users pushes the handle 21 horizontally along the direction X, to move the support 22 to the work position; when the first pin 211 arrives in the first segment 111*a*, users need to pull the latch 21*a* out of the positioning hole 22*a* by hand, to unlock the handle 21 relative to the support 22, then press down the handle 21, to rotate the handle 21 to the handle-pressed-down position; during the rotation of the handle 21 to the handle-pressed-down position, the first pin 211 limited in the first segment 111*a* pushes against the first sheet 11 of the chassis 10, so that the support 22 is moved to the work position; when the handle 21 arrives at the handle-pressed-down position, the support 22 arrives at the work position, and the motherboard on the support 22 is plugged back into the socket of the server 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A cabinet comprising:

a chassis;

a bracket comprising a support and a handle, wherein the support is movable between a work position and a transition position relative to the chassis, and the support is further rotatable between the transition position and an open position relative to the chassis, the handle is rotatable between a handle-lifted-up position and a handle-pressed-down position relative to the support; and a self-locking component connected to the support and the chassis, wherein when the handle rotates from the handle-pressed-down position to the handle-lifted-up position, the support moves from the work position to the transition position, when the support rotates from the transition position to the open position, the support extends out of the chassis, the self-locking component locks the support at the open position;

the chassis defines a first sliding groove and a second sliding groove, the support defines an arc groove, the handle comprises a first pin slidable in the arc groove, and the first pin is slidable into or out of the first sliding groove, the support comprises a second pin slidable in the second sliding groove, when the handle rotates from the handle-pressed-down position to the handle-lifted-up position, the first pin slides in the arc groove and slides in the first sliding groove simultaneously, the first pin pushes against the chassis to move the support from the work position to the transition position, and the second pin moves in the second sliding groove with the support; when the support rotates from the transition position to the open position, the support rotates around the second pin, and the first pin slides out of the first sliding groove; when the support rotates from the open position to the transition position, the support rotates around the second pin, the first pin slides into the first sliding groove; when the handle rotates from the handle-lifted-up position to the handle-pressed-down position, the first pin slides in the arc groove and slides in the first sliding groove simultaneously, the first pin pushes against the chassis to move the support from transition position to the work position, and the second pin moves in the second sliding groove with the support;

the second sliding groove comprises a straight-line segment and positioning segment, the straight-line segment extends along a direction of a movement of the support between the work position and the transition position, the positioning segment communicates to an end of the straight-line segment, when the support is at the transition position, the positioning segment is beneath the second pin, when the support rotates from the transition position to the open position, the second pin drops into the positioning segment to be positioned in the positioning segment.

2. The cabinet of claim 1, wherein the support further comprises a lever shaft, the chassis comprises a supporting surface, the supporting surface is parallel to the direction of the movement of the support between the work position and the transition position, when the support rotates from the open position to the transition position, the lever shaft pushes against the supporting surface to lever up the second pin, so that the second pin slides out of the positioning segment and slides into the straight-line segment.

3. The cabinet of claim 1, wherein the first sliding groove comprises a first segment, a second segment, and a third segment connected in sequence, the second segment extends in a direction of the movement of the support between the work position and the transition position, the first segment and the third segment communicate to two opposite sides of the second segment respectively, the third segment extends through a top side of the chassis so that the first pin can slide into or out of the first sliding groove, when the handle rotates between the handle-lifted-up position and the handle-pressed-down position, the first pin slides in the first segment and pushes against the chassis to move the support between the work position and the transition position; when the handle is at the handle-lifted-up position, the first pin is at the end of the second segment communicating to the first segment.

4. The cabinet of claim 3, wherein the support defines a positioning hole, the handle comprises a latch, when the handle is at the handle-lifted-up position, the latch is inserted into the positioning hole thereby positioning the handle at the handle-lifted-up position.

5. The cabinet of claim 1, wherein the self-locking component comprises a spring sheet, a link rod component, and a third pin, the spring sheet is located on the chassis, the link rod component connects the support and the third pin, the chassis defines a third sliding groove, the third pin is slidably inserted into the third sliding groove, the spring sheet defines a bevel and a limiting hole; the support moves the third pin by the link rod component, when the support moves to the handle-lifted-up position from the handle-pressed-down position, the third pin moves to the limiting hole and pushes the bevel to deform the spring sheet, when the third pin is aligned with the limiting hole, the spring sheet resets to insert the third pin into the limiting hole, so that the third pin is positioned in the limiting hole and the support is positioned at the handle-lifted-up position.

6. The cabinet of claim 5, wherein the link rod component comprises a first link rod, a second link rod, and a third link rod, the first link rod connects the second link rod and the support, the second link rod connects the first link rod and the chassis, the third link rod connects the second link rod and the third pin.

7. The cabinet of claim 5, wherein the spring sheet comprises a plane section and a bump section, the plane section is installed on the chassis, the limiting hole is located on the plane section, the bump section is arched relative to the plane section, the bevel is located on the bump section; when the third pin moves to the limiting hole, the third pin pushes the bevel to deform the plane section, until the third pin is aligned with the limiting hole, the plane section resets to insert the third pin into the limiting hole.

8. The cabinet of claim 7, wherein the plane section defines a notch, the chassis comprises a guiding nail, the guiding nail comprises a cylinder and a nail head, the cylinder extends through the notch to guide a direction of the deformation of the plane section, the nail head is configured for stopping the deformation of the plane section.

9. A server comprising:

a plurality of electronic devices; and a cabinet comprising:

a chassis configured for holding a part of the plurality of electronic devices;

a bracket comprising a support and a handle, wherein the support is configured for holding another part of the plurality of electronic devices, the support is movable between a work position and a transition position relative to the chassis, and the support is further rotatable between the transition position and an open position relative to the chassis, the handle is rotatable between a handle-lifted-up position and a handle-pressed-down position relative to the support; and a self-locking component connected to the support and the chassis, wherein when the handle rotates from the handle-pressed-down position to the handle-lifted-up position, the support moves from the work position to the transition position, when the support rotates from the transition position to the open position, the support extends out of the chassis, the self-locking component locks the support at the open position;

the chassis defines a first sliding groove and a second sliding groove, the support defines an arc groove, the handle comprises a first pin slidable in the arc groove, and the first pin is slidable into or out of the first sliding groove, the support comprises a second pin slidable in the second sliding groove, when the handle rotates from the handle-pressed-down position to the handle-lifted-up position, the first pin slides in the arc groove and slides in the first sliding groove simultaneously, the first pin pushes against the chassis to move the support from the work position to the transition position, and the second pin moves in the second sliding groove with the support; when the support rotates from the transition position to the open position, the support rotates around the second pin, and the first pin slides out of the first sliding groove; when the support rotates from the open position to the transition position, the support rotates around the second pin, the first pin slides into the first sliding groove; when the handle rotates from the handle-lifted-up position to the handle-pressed-down position, the first pin slides in the arc groove and slides in the first sliding groove simultaneously, the first pin pushes against the chassis to move the support from transition position to the work position, and the second pin moves in the second sliding groove with the support;

the second sliding groove comprises a straight-line segment and positioning segment, the straight-line segment extends along a direction of a movement of the support between the work position and the transition position, the positioning segment communicates to an end of the straight-line segment, when the support is at the transition position, the positioning segment is beneath the second pin, when the support rotates from the transition position to the open position, the second pin drops into the positioning segment to be positioned in the positioning segment.

10. The server of claim 9, wherein the support further comprises a lever shaft, the chassis comprises a supporting surface, the supporting surface is parallel to the direction of the movement of the support between the work position and the transition position, when the support rotates from the open position to the transition position, the lever shaft pushes against the supporting surface to lever up the second pin, so that the second pin slides out of the positioning segment and slides into the straight-line segment.

11. The server of claim 9, wherein the first sliding groove comprises a first segment, a second segment, and a third segment connected in sequence, the second segment extends in a direction of the movement of the support between the work position and the transition position, the first segment and the third segment communicate to two opposite sides of the second segment respectively, the third segment extends through a top side of the chassis so that the first pin can slide into or out of the first sliding groove, when the handle rotates between the handle-lifted-up position and the handle-pressed-down position, the first pin slides in the first segment and pushes against the chassis to move the support between the work position and the transition position; when the handle is at the handle-lifted-up position, the first pin is at the end of the second segment communicating to the first segment.

12. The server of claim 9, wherein the self-locking component comprises a spring sheet, a link rod component, and a third pin, the spring sheet is located on the chassis, the link rod component connects the support and the third pin, the chassis defines a third sliding groove, the third pin is slidably inserted into the third sliding groove, the spring sheet defines a bevel and a limiting hole; the support moves the third pin by the link rod component, when the support moves to the handle-lifted-up position from the handle-pressed-down position, the third pin moves to the limiting hole and pushes the bevel to deform the spring sheet, when the third pin is aligned with the limiting hole, the spring sheet resets to insert the third pin into the limiting hole, so that the third pin is positioned in the limiting hole and the support is positioned at the handle-lifted-up position.

13. The server of claim 12, wherein the link rod component comprises a first link rod, a second link rod, and a third link rod, the first link rod connects the second link rod and the support, the second link rod connects the first link rod and the chassis, the third link rod connects the second link rod and the third pin.

14. The server of claim 12, wherein the spring sheet comprises a plane section and a bump section, the plane section is installed on the chassis, the limiting hole is located on the plane section, the bump section is arched relative to the plane section, the bevel is located on the bump section; when the third pin moves to the limiting hole, the third pin pushes the bevel to deform the plane section, until the third pin is aligned with the limiting hole, the plane section resets to insert the third pin into the limiting hole.

15. The server of claim 14, wherein the plane section defines a notch, the chassis comprises a guiding nail, the guiding nail comprises a cylinder and a nail head, the cylinder extends through the notch to guide a direction of the deformation of the plane section, the nail head is configured for stopping the deformation of the plane section.

* * * * *